United States Patent [19]
Pandey et al.

[11] Patent Number: 5,407,906
[45] Date of Patent: Apr. 18, 1995

[54] EPITAXIAL LAYERS OF 2122 BCSCO SUPERCONDUCTOR THIN FILMS HAVING SINGLE CRYSTALLINE STRUCTURE

[75] Inventors: Raghvendra K. Pandey; Kanwal K. Raina; Narayanan Solayappan, all of College Station, Tex.

[73] Assignee: The Texas A&M University System, College Station, Tex.

[21] Appl. No.: 194,494

[22] Filed: Feb. 10, 1994

Related U.S. Application Data

[63] Continuation-in-part of Ser. No. 945,504, Sep. 16, 1992, Pat. No. 5,314,869.

[51] Int. Cl.[6] .............................................. C30B 19/02
[52] U.S. Cl. ...................................... 505/239; 505/452; 505/729; 117/54; 428/930; 428/702
[58] Field of Search ............... 505/239, 729, 452; 156/621, 622; 428/930, 702; 427/62, 63; 117/54

[56] References Cited

PUBLICATIONS

Belt et al, "Superconducting film growth on LaGaO3 substrates by liquid phase epitaxy", Appl. Phys. lett. 56(18) Apr. 1991, pp. 1805–1807.
Balestino et al, "Epitaxial Films Of BSCCO growth from liquid KCl solutions onto several substrates", IEEE Transactions On Magnetics, vol. 27, No. 2, Mar. 1991, pp. 1589–1591.

*Primary Examiner*—Roy V. King
*Attorney, Agent, or Firm*—Baker & Botts

[57] ABSTRACT

A substantially single phase, single crystalline, highly epitaxial film of $Bi_2CaSr_2Cu_2O_8$ superconductor which has a $T_c$ (zero resistance) of 83K is provided on a lattice-matched substrate with no intergrowth. This film is produced by a Liquid Phase Epitaxy method which includes the steps of forming a dilute supercooled molten solution of a single phase superconducting mixture of oxides of Bi, Ca, Sr, and Cu having an atomic ratio of about 2:1:2:2 in a nonreactive flux such as KCl, introducing the substrate, e.g., $NdGaO_3$, into the molten solution at 850° C., cooling the solution from 850° C. to 830° C. to grow the film and rapidly cooling the substrate to room temperature to maintain the desired single phase, single crystalline film structure.

9 Claims, 6 Drawing Sheets

EPITAXIAL LAYERS OF 2122 BCSCO SUPERCONDUCTOR THIN FILMS HAVING SINGLE CRYSTALLINE STRUCTURE

This invention was developed pursuant to research sponsored in part by the U.S. Government under NASA Grant No. NAGW-1590, and the U.S. Government may have certain fights in the invention.

This application is a continuation-in-part of application Ser. No. 07/945,504, filed Sep. 16, 1992, now U.S. Pat. No. 5,314,869.

BACKGROUND OF THE INVENTION

1. Field of the Invention

The present invention relates generally to the field of superconductor materials and methods for their manufacture. More particularly, the invention relates to the use of Liquid Phase Epitaxy (LPE) methods for growing substrate supported single phase, single crystalline films of the superconductor class based on oxides of Bi, Ca, Sr and Cu, known as BCSCO, and in particular the 80K-phase of that material known as 2122.

2. Description of the Related Art

Since the discovery of Bi—Ca—Sr—Cu—O (BCSCO) superconducting systems in 1988 there have been numerous reports on the thin film growth of this material. High quality epitaxial films of this superconducting material are of vital importance for a large number of applications. Various techniques such as electron beam deposition, magnetron sputtering, molecular beam epitaxy, and laser ablation have been widely used for the growth of thin films of BCSCO superconducting material. These methods are extremely costly and they have not been successful in producing single crystalline thin film specimens. In contrast there have been only a few reports on the growth of these films by the LPE method.

The main advantage of the LPE process over other thin film techniques, with the exception of laser ablation, is the superior stoichiometric control of the grown layers in the film. This is not possible with other methods due to the different vapor pressures of the individual elements of BCSCO at fixed substrate temperatures. Moreover, because of the non-uniform stoichiometric control with these techniques, the films have to be annealed subsequent to the growth to achieve the 80 K. or 110 K. phases. The post deposition annealing treatment of the films imposes a severe restriction on the choice of the substrates because of the possibility of diffusion of substrate constituents into the film.

The substrates that have been so far widely used for growing superconducting films are MgO and $SrTiO_3$. Although these substrates have a very good structural stability at higher temperatures, they suffer from a large lattice constant mismatch with the 2122 phase of BCSCO. This drawback inhibits the formation of high quality epitaxial films. Recently, $LaGaO_3$ and $NdGaO_3$ have been used to grow thin films of BCSCO superconducting material using the LPE technique. Both of these substrates have smaller lattice mismatch with $Bi_4CaSr_2Cu_2O_{8+x}$ than MgO and $SrTiO_3$. However, $LaGaO_3$ suffers the disadvantage of structural instability at higher temperatures due to its phase transition at 875° C. from orthorhombic to rhombohedral structure.

The liquid phase epitaxy method has been used to grow thin films of the 2122-BCSCO phase from $Bi_4Ca_3Sr_3Cu_4O_x$ charge compositions. Addition of PbO in the initial charge composition has also been used to promote the 80K-phase of BCSCO superconducting film. But the thin film growth of single crystalline 80K-phase material from the supercooled solutions of $Bi_2CaSr_2Cu_2O_{8+x}$—KCl system using the LPE process has not been described in the prior art.

High quality and large single crystals of the three leading high-$T_c$ materials, namely, 123 YBCO, BCSCO and Tl-based compounds, have not become available to this date either in bulk or even in thin film form in spite of intensive research to achieve this goal throughout the world in various laboratories. There are some inherent problems associated with all these materials which are very difficult to solve by conventional techniques of crystal growth and synthesis. These problems encountered in producing single crystals of Bi-based superconductors can include 1. incongruent nature of the melt; 2. reactivity of the melt with crucible materials (even with platinum); 3. chemical instability; 4. extreme anisotropy owing to the layered habit and 5. the affinity toward intergrowth. Because of these inherent problems associated with the high-$T_c$ materials the growth of large, homogeneous, single phase, single crystal with no intergrowths has not been possible even though high levels of epitaxy have been achieved.

SUMMARY OF THE INVENTION

It is a general object of this invention to provide a method for producing single phase, single crystal highly epitaxial thin films of the 2122 BCSCO superconductor on lattice-matched substrates which, at least in part, obviates the foregoing and other problems faced by prior workers in this field.

It is also an object of this invention to provide such a method that is practical to perform and scale up for industrial applications.

It is another object of this invention to provide such a method that is reliable and reproducible for producing high quality single phase, single crystal thin film components based on 2122 BCSCO superconducting materials.

It is a further object of this invention to provide a high $T_c$ superconductor device component that is fully operable at the temperature of liquid nitrogen (77 K.).

It is another object of this invention to provide a superconductor device component that can be employed in infrared light-based systems.

These and other objects of the present invention that will be apparent to those skilled in the art are achieved by providing a single phase, single crystalline superconductor film of the 2122 phase of BCSCO having a $T_c$ (onset) of 90 K. and a $T_c$ (zero resistance) of 83 K. on a lattice-matched single crystal substrate with no intergrowth. The 2122 phase composition of the preferred film is $Bi_2Ca_{1.05}Sr_{2.1}Cu_{2.19}O_x$ and the preferred substrate is a twin free, c-axis oriented, single crystal of $NdGaO_3$. The single phase, single crystalline superconductor film of this invention has 100% reflectivity in the infrared regions at 77 K.

The present invention also provides a method for growing substantially single phase, single crystalline highly epitaxial films of the 2122 phase of BCSCO on a lattice-matched substrate without intergrowth and having excellent properties as grown without post annealing steps. This method generally comprises the steps of forming a dilute, supercooled molten solution (melt) of a single phase, superconducting mixture of the BCSCO oxides in the stoichiometric proportions for the 2122 phase (i.e., the atomic ratios of Bi:Ca:Sr:Cu are approximately 2:1:2:2) in a non-reactive flux (e.g. KCl). This melt is employed in a carefully controlled Liquid Phase Epitaxy (LPE) process of the type generally known in the art. In this LPE process, the substrate is introduced into the melt at about 850° C. and the melt is slowly cooled to about 830° C. during which period the single phase, single crystalline highly epitaxial film of 2122 BCSCO is deposited on the substrate. At the end of the growth period, the film-containing substrate is rapidly cooled (i.e., quenched) to room temperature at a rate sufficient to maintain the single phase, single crystalline structure of the grown superconductor film with high $T_c$ properties [e.g. $T_c$ (zero resistance)=83 K.].

DESCRIPTION OF THE INVENTION

Three members of Bi—Ca—Sr—Cu—Oxides family have been identified to be superconductors. These members have similar crystal structures so that the metal-oxygen layers can be represented by a homologous series represented by $Bi_2Ca_{n-1}Sr_2Cu_nO_{2n+4}$. The individual superconducting phases in this family differ from each other in the number of $CuO_2$ planes and Ca layers per unit cell. The origin of superconductivity in this family as well as in 123 YBCO and Tl-based compounds is believed to be because of the presence of $CuO_2$ planes in the unit cell. The number of these copper-oxide planes plays the decisive role in the superconducting properties of Bi-based compounds. As their number (n) increases so do the values of the superconducting transition ($T_c$) and lattice parameter along the c-axis. For example, in the 2021-phase n=1, $T_c$=10 K. and c=24 Å; in the 2122-phase n=2, $T_c$=80 K. and c=30 Å; and in the 2223-phase n=3, $T_c$=110 K. and c=37 Å. Similar results are found also for the different superconducting phases in the TlBaCaCu-oxide system. Amongst the three superconducting phases the 2122-phase represented by the chemical formula $Bi_2CaSr_2Cu_2O_8$ is the most promising phase both scientifically and technologically. The 10 K. phase is scientifically attractive but of little technological importance because of the low value of its transition temperature and the 110 K. phase is almost impossible to synthesize as a single phase material in its pure form. On the other hand, the 2122-phase with $T_c$=80 K. can be synthesized as a single phase material in its purest form. Moreover, this material is environmentally very stable and unlike the 123 YBCO does not suffer degradation when exposed to the atmospheric conditions. Also, it does not exhibit any aging effects even after many years. In addition this material is non-toxic (which can be of advantage in space experiments) and it exhibits its very mild corrosiveness in the molten state to the crucible materials during crystallization and solidification. These advantages make the 2122-phase the most attractive member of the family for a large number of applications.

The present invention employs the well established technique of Liquid Phase Epitaxy (LPE). The LPE method is inexpensive and most adaptable to engineering scaling up and optimization. It is a widely used method in industry for the growth of compound semiconductor films for integrated circuits and other applications. Unlike all other methods of film growth, LPE is capable of producing truly single crystalline film. It is not limited only to the epitaxial growth of a film on a substrate in which only one axis, usually the axis corresponding to the perpendicular direction of the substrate's surface, of the crystal unit cell is aligned.

Figure 1:
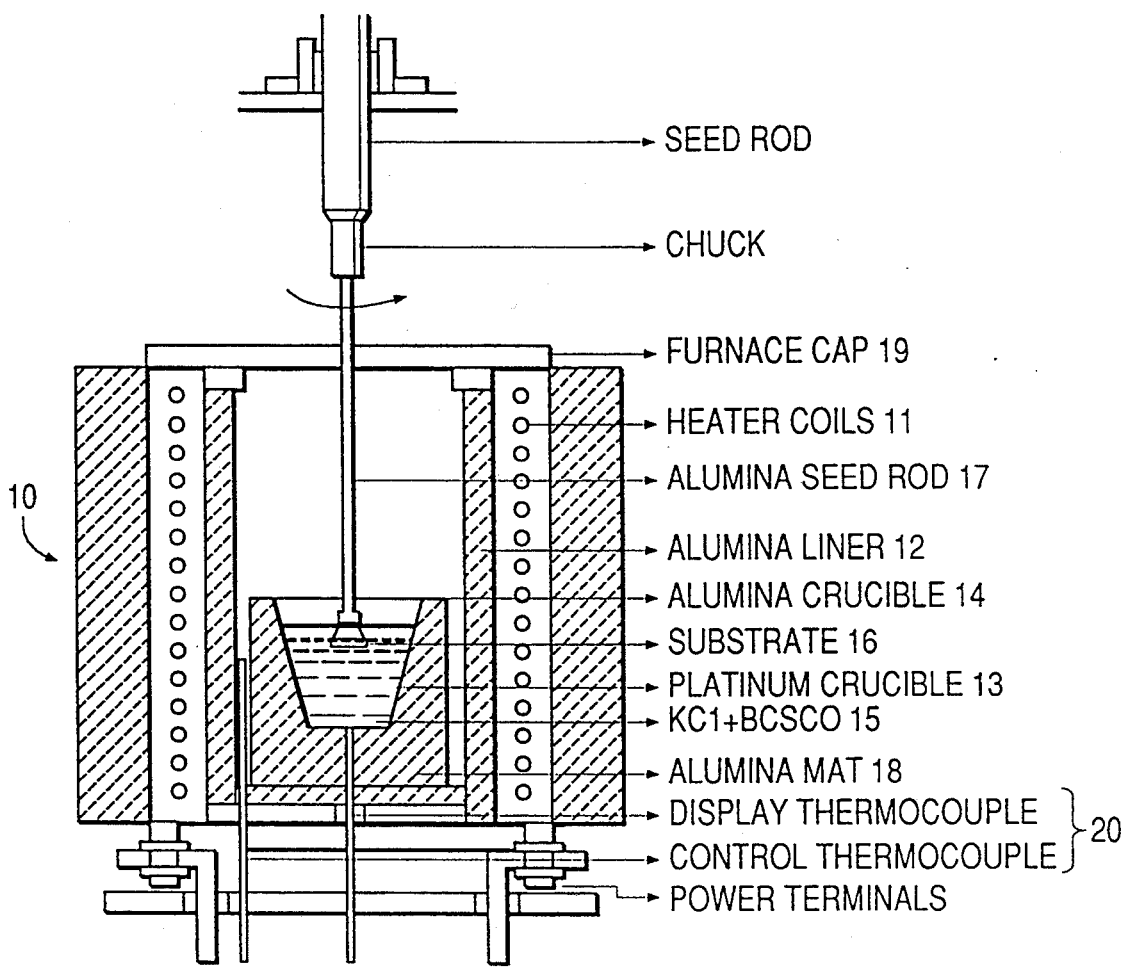
FIG. 1 is a schematic drawing in cross section of one form of apparatus useful in practicing the method of the present invention.

One form of apparatus suitable for carrying out the LPE method of the present invention is shown in FIG. 1. Basically this equipment comprises a resistively heated furnace with the provision for translation and rotation of substrates. Because of the multiphase nature of BCSCO and the associated temperature sensitivity, the equipment should be capable of maintaining the temperature in the growth chamber at ±1° C.

With reference to FIG. 1, the furnace is shown generally at 10. It is resistively heated by means of heater coils 11 and insulated with an alumina liner 12. The superconductor melt crucible 13, is preferably made of platinum and contained within an alumina crucible 14. The melt is shown at 15. The substrate 16, is positioned rotatably in the melt by the alumina seed rod 17. The alumina crucible sits on an alumina mat 18 and the furnace is closed with cap 19. The furnace is also preferably provided with display and control thermocouples 20.

In order to form the charge of oxide materials necessary to produce the single phase 2122 BCSCO crystalline material a particulate source of Bi, Ca, Sr, and Cu must be provided. The starting materials suitable for this purpose generally include the oxides or oxide precursors of the four metallic elements. The preferred starting materials are $Bi_2O_2$, $CaCO_3$, $SrCO_3$ and CuO. It is preferred to employ the carbonate form of calcium and strontium and the oxide form of bismuth and copper. The selected starting materials should be highly pure, at least 99% and preferably at least 99.9% pure. Any contaminate present should not be reactive with the melt or the substrate. The particle size of the starting materials for the charge generally can be in the range of from about 2 to 10 μm with particles in the range of 2 to 5 μm being preferred. Particle size can have some effect on the length of time necessary to complete the annealing step described below.

The objective in forming the charge material is to provide to the melt a material that is a single phase (i.e. 2122 BCSCO) and has superconducting properties per se. This objective is preferably achieved by providing the starting materials in atomic ratios that are stoichiometric for the 2122 phase and by the use of annealing techniques. The use of atomic ratios for Bi:Ca:Sr:Cu of about 2:1:2:2 is very important to achieving the objective of forming a single phase 2122 superconducting charge. It will be appreciated that slight deviations from absolute stoichiometry can be utilized without adversely affecting the charge properties. Particularly, up to about 5% stoichiometric excess of any metallic component generally will still achieve the stated objective. In general the charge material can be tested prior to its use in the LPE reaction to insure the presence of a single superconducting phase.

One preferred embodiment of this invention which facilitates the objective of starting with a single phase superconducting charge is to subject the mixed oxide starting materials to an annealing step. This step comprises heating the oxides at an elevated temperature for an extended period of time to stabilize the mixture in the single phase superconducting form. The temperature of this annealing step should be below the melting point of 2122 BCSCO (i.e. 890° C.). In general, longer times and lower temperatures achieve the same results as shorter times at high temperatures. Typical annealing temperatures are from about 800° C. to 880° C., with temperatures of about 850° preferred. Times can vary from about 50 to about 100 hours, with about 100 hours being preferred. Charge mixtures with smaller particle sizes, e.g. in the range of 5 to 10 $\mu$m, can be heated for shorter times than mixtures of large particles. The annealing step is conveniently and preferably carried out in the presence of air although an oxygen or inert atmosphere could be employed if desired.

In the case where oxide precursors e.g. carbonates are employed, it is useful to calcine the mixed salts prior to the annealing step to assure their conversion to the oxide form. As is known in the field, this calcination step can generally be performed at temperatures of from about 800° to 840° C. and times of about 10 to 15 hrs. In the preferred embodiment the charge mixture is calcined twice at 800° C., and once at 850° C. each for about 12 hours. Preferably the calcining and annealing steps are performed in the same crucible.

Prior to its use in the LPE process it is also preferable to subject the annealed charge materials to a melting step to promote chemical homogeneity of the mixture. This can be done at any convenient temperature above the melting point of the 2122 phase (e.g. 890°) and is preferably done at 900° C. Times of holding in molten form can vary from about ½ hr. to 2 hrs. with melting times of about 1 hour being preferred.

The second component for carrying out the LPE process is a flux or solubilizing agent for the oxide superconductor material. Materials in which 2122 BCSCO are soluble can include halides or other salts and mixed systems. This flux material is preferably chosen from the group of alkali metal halides such as KCl, NaCl, KF or mixtures thereof. The preferred flux is KCl. Selection of a proper flux material can be made with regard to its appropriate melting point, solubility characteristics for the oxide superconductor and its inertness to the substrate and crucible. The ability to easily separate the flux from the superconducting film deposited on the substrate is also a factor in selecting suitable flux materials.

The LPE reaction is preferably carried out in a dilute solution of the oxide superconductor in the flux material. Typically ratios (by weight) of flux: oxides can be in the range of from about 4:1 to about 6:1, with the preferred ratio being 4:1. As the ratio increases, more oxides superconductor material goes into solution. At ratios above about 6:1 the greater quantity of oxides in solution will result in faster deposition on the substrate and may jeopardize the objective of obtaining the superconductor in single crystal form.

The selection of a suitable substrate for carrying out the LPE process can be made primarily with regard to achieving a lattice match with the 2122-BCSCO phase and its non-reactivity with the melt. In general the substrate should be substantially pure, defect free, single crystalline and preferably oriented in one specific crystallographic direction. Substrates with intergrowth and diffusion tendencies should be avoided, if possible. A good match with the lattice constants of the 2122 phase is also important in achieving both epitaxy and single crystallinity in the superconducting film. Various substrate materials and their physical properties are known in the prior art. A particularly preferred class of substrate materials is the rare earth gallates, such as $LaGaO_3$, $PrGaO_3$, $NdGaO_3$, $SmGaO_3$, $EuGaO_3$, $GdGaO_3$, $TbGaO_3$, $DyGad_3$, $HoGaO_3$, $ErGaO_3$ and mixtures thereof. The most preferred substrate is $NdGaO_3$. The substrate may be provided in any convenient size and shape depending on the desired properties of the deposited superconductor layer. In practice substrates on the order of 1 $cm^2$–2.5 $cm^2$ have been satisfactorily used in the LPE process.

Figure 2:
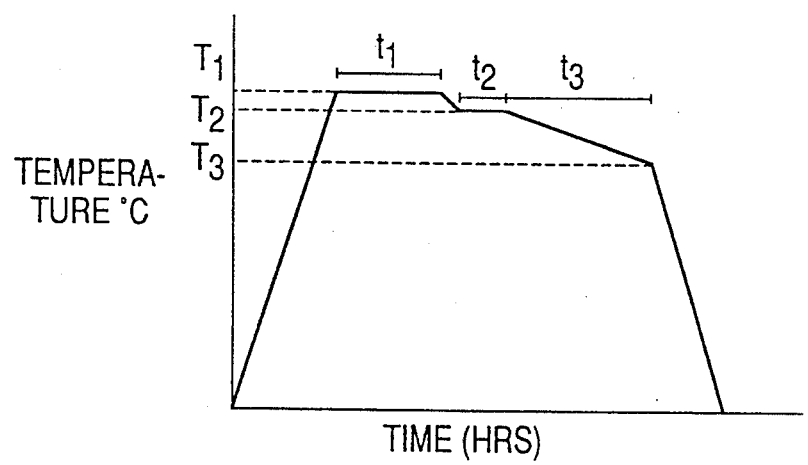
FIG. 2 is a graphical representation of one embodiment of the temperature/time profile for LPE growth according to the present invention.

In carrying out the LPE process a melt containing a homogeneous molten solution of the 2122-BCSCO in the flux material is first prepared and then brought to thermal equilibrium at a temperature below the melting point of the 2122 phase (i.e. supercooled). Forming the homogeneous melt can be accomplished in any number of ways that will be apparent to those skilled in the art, such as by simple mixing of the components. In the preferred process, the oxidic charge is first melted as described above and allowed to resolidify. The flux is then placed on top of the solid oxide mass and the mixture is reheated to a temperature above the melting point of the 2122 phase e.g. 920°–940° C. This temperature ($T_1$) is held for a period of time (e.g. 8 to 12 hrs. to achieve thermal equilibrium and chemical homogeneity. This thermal treatment or "soak" period ($t_1$) is followed by a cooling of the melt to the desired start of the growth temperature ($T_2$). Preferably the melt is held at this temperature for a second short soak period ($t_2$) of about 4 to 6 hours. The substrate is introduced into the melt after the second soak and slowly cooled to the final growth temperature ($T_3$) over a growth period ($t_3$). Finally the substrate is removed from the melt at $T_3$ and rapidly cooled to room temperature. A typical time/temperature profile for this preferred process is shown in FIG. 2.

Of critical importance in achieving the single phase, single crystalline highly epitaxial film of the present invention is the selection of a proper growth temperature range (i.e. $T_2$–$T_3$) coupled with an appropriate cool down of the substrate. It has been found that when growth is initiated at about 850° C. and concluded at about 830° C., and the substrate is rapidly cooled to room temperature, the stated objectives are achieved. If higher, lower or even broader $T_2$–$T_3$ ranges are employed the resulting ffim will not be single phase and single crystalline 2122 BCSCO. It will be recognized that some tolerance for selecting these temperatures can be permitted while still maintaining the stated objective. Thus "about 850° C." and "about 830° C." as used herein is intended to include and cover those temperatures ±1° C. The rate of slow cooling over time $t_3$ should be slow enough to achieve the desired single phase, single crystalline form. Typically this can be accomplished at rate of form about 1° C. to 4° C. per hour with the preferred rate being 1.5° C.–3° C. per hour. At these rates the growth period $t_3$ will run from about 5 to about 20 hours.

After the conclusion of the growth period it is critical to rapidly cool the substrate/superconductor thin layer to room temperature. This quenching step has been found to prevent the formation of sub-phases and preserve the single 2122 phase in single crystalline form. The rate of rapid cooling necessary to achieve this objective can be determined experimentally, but generally falls in the range of from about 160° C./minute to about 800° C./minute. Preferred are rates above about 200° C./minute. Thus, the preferred quench times will be about 3 to 4 minutes.

After the quench step the substrate can be washed with water or other nonreactive solvent to remove any residual flux material carded on the film.

The resulting product is a high quality single phase, single crystalline, highly epitaxial thin layer of 2122 BCSCO having excellent superconductor properties: $T_c$(onset)=90 K., $T_c$(zero resistance)=83 K. The composition of the superconductor was determined to be $Bi_2Ca_{1.05}Sr_{2.1}Cu_{2.19}O_x$, very close to stoichiometric 2122 BCSCO. Very smooth film having a large surface area can be produced by the method of this invention. Typical film thickness can vary from about 0.25 to 2 $\mu m$ with thickness of about 0.5 to 1.0 micron being preferred for most applications and film surface areas of up to 1 $cm^2$ or more can be achieved using this process.

As will be appreciated by those skilled in the art, the product of this invention has significant commercial potential for use in many optical and electronic devices including IR photodetectors, IR Fabry-Perot Intefe- rometers, Microwave Power Transmission and Josephson Junction Devices. Of particular significance is the film's $T_c$ above the boiling point of liquid nitrogen (77 K.) and the 100% reflectivity of this film in the far infrared regime (2–25 micron wave lengths).

The invention will be further understood and exemplified with reference to the following non-limiting example. In the following example the identification of various phases formed at different growth temperature regimes has been done by x-ray powder diffraction studies and Rutherford Backscattering (RBS) technique is used for determining the chemical compositions of the films.

EXAMPLE

High purity grade powders of $Bi_2O_3$ (99.9%), $CaCO_3$ (99.9%), $SrCO_3$ (99.999%) and $CuO$ (99.9%) were thoroughly mixed in the atomic ratios of 2:1:2:2 (Bi:Ca:Sr:Cu). The powder mixture was calcined at 800° C. (twice) and 850° C. (once) for 12 h each. The so-calcined charge was then pelletized by uniaxial cold pressing at 70 MPa and then annealed at 850° C. for 100 h in air. About 10 g of this annealed charge was finely ground and melted at 900° C. for 1 h in a 50 cc platinum crucible. (The apparatus of FIG. 1 was employed) Then 40 g of KCl powder was added at the top of the solidified mass. This ratio of 4:1 between KCl and BCSCO was maintained for all the tests.

In order to demonstrate the effects of growth conditions on the formation of single crystalline 80 K.-phase material, the growth was accomplished by slow cooling in the following temperature regimes: (i) 880°–860° C.; (ii) 860°–840° C.; and (iii) 850°–830° C. and (iv) 890°–835° C. After sequentially loading the charge and the KCl flux in the crucible, the furnace was heated to about 940° C. and left there for 12 h to achieve equilibrium of the solution. The solution was then precooled in 1 h to the maximum temperature level of individual growth regimes, as described already. The solution was held at this temperature for 5 h. Then a $NdGaO_3$ substrate attached by platinum wires to a high purity alumina rod was slowly lowered to a depth of about 5 mm within the solution. The growth period was varied from 7–15 h. The seed rotation for all the experiments was set at 40 rpm. After the completion of the film growth, the substrates were slowly withdrawn form the solution and spun at about 200 rpm to remove molten KCl adhering to the film. Then the samples (except (iv)) were cooled to room temperature at two different rates: (i) 130° C. per hour, and (ii) at a quenching rate. In one test quenching occurred in about 1 minute. In another test quenching occurred in about 3–4 minutes. To remove the residual KCl flux that might still be adhering to the film, the substrate was washed with warm distilled water. The thickness of the films varied from 0.5 to 1 $\mu m$, depending on the cooling rate of the solution.

Figure 3:
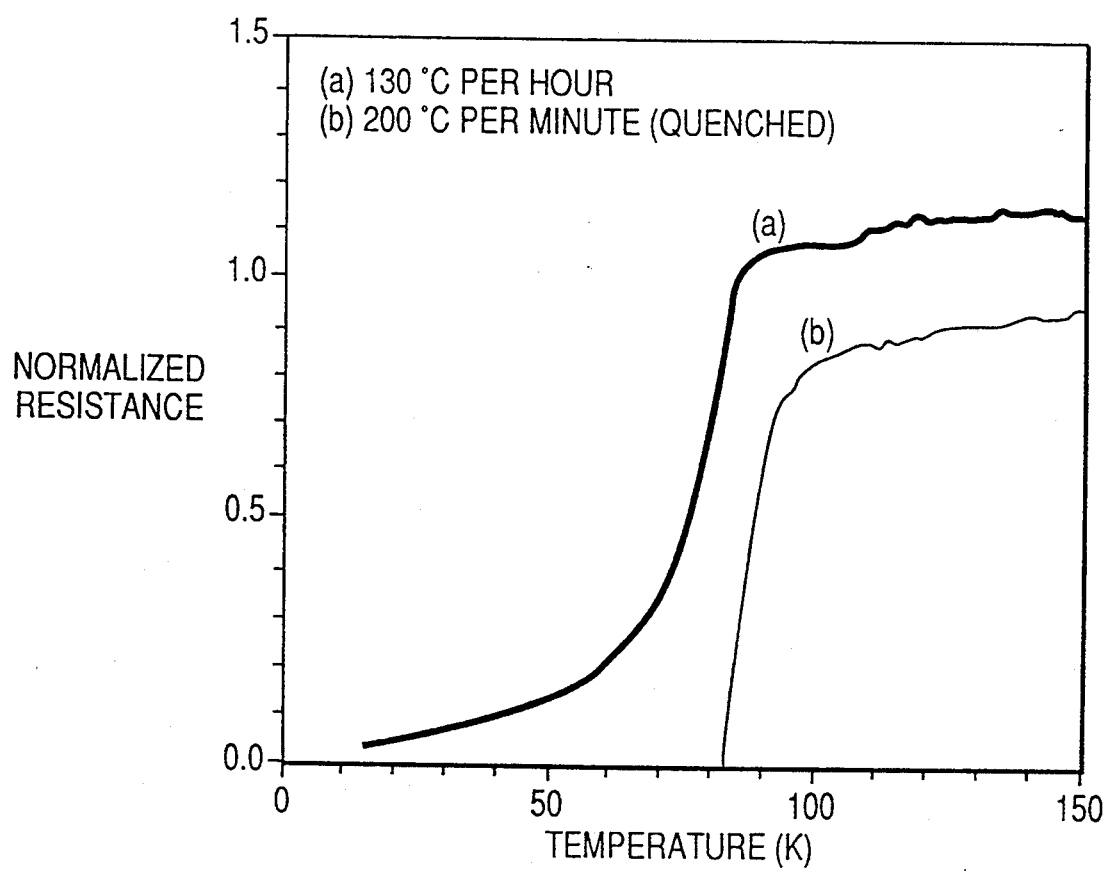
FIG. 3 is a graphical representation of the relationship between resistance and temperature for two 2122 BCSCO films cooled at different rates.
Figure 4:
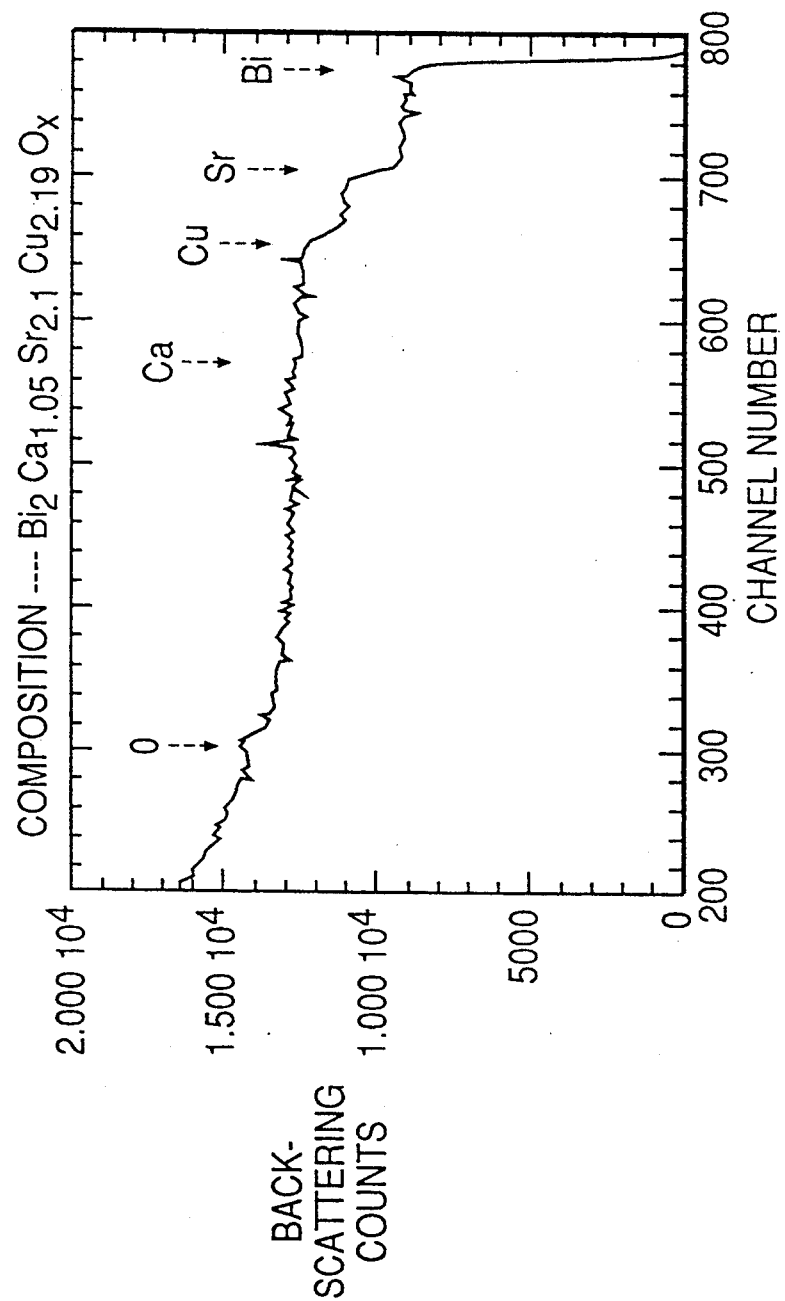
FIG. 4 shows compositional analysis of a 2122 BCSCO film made according to the present invention using Rutherford Back Scattering. (RBS)
Figure 5A:
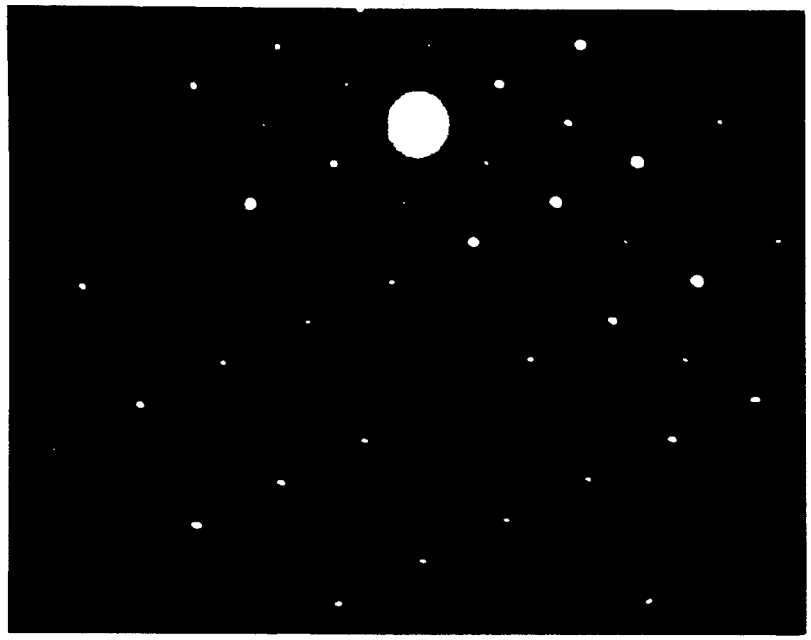
FIGS. 5a and 5b show electron diffraction pattern for a $NdGaO_3$ substrate and a 2122 BCSCO thin film respectively.
Figure 5B:
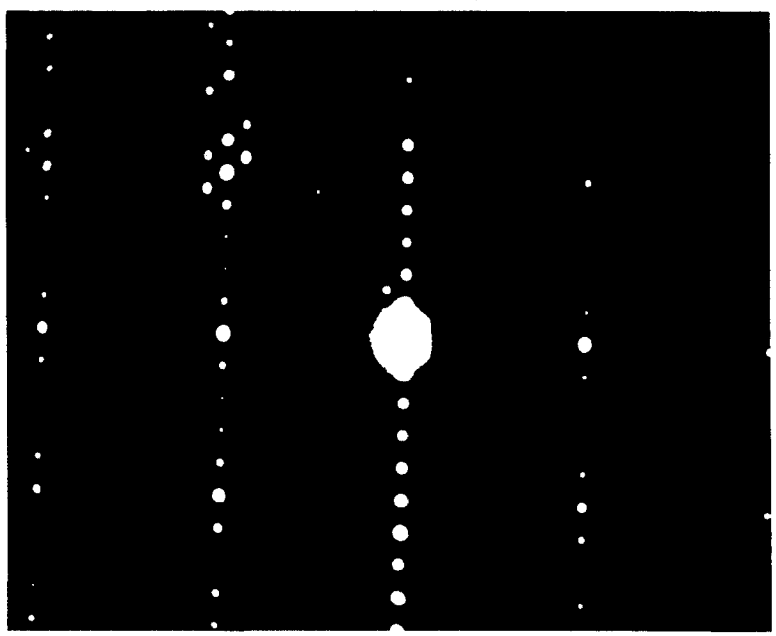
Figure 6A:
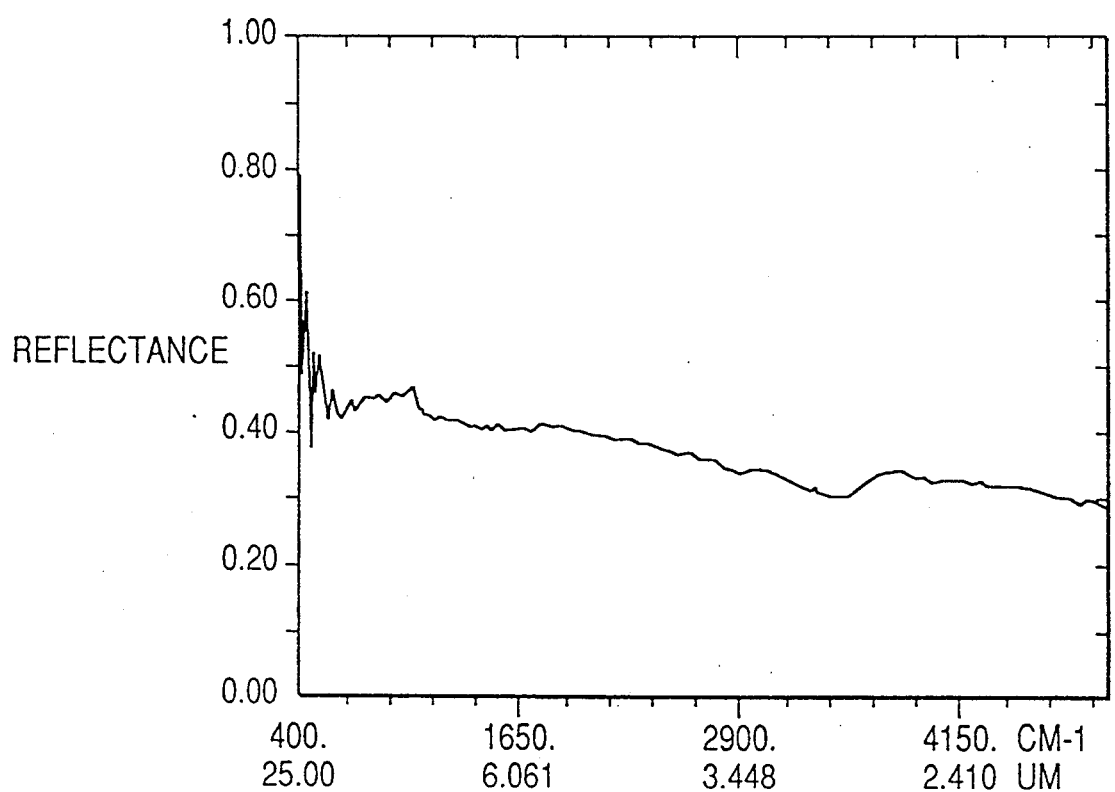
FIGS. 6a and 6b are graphical representations of the relationship between reflectance and wavelength (in the infrared region) of 2122 BCSCO film at room temperature and 77 K. respectively.
Figure 6B:
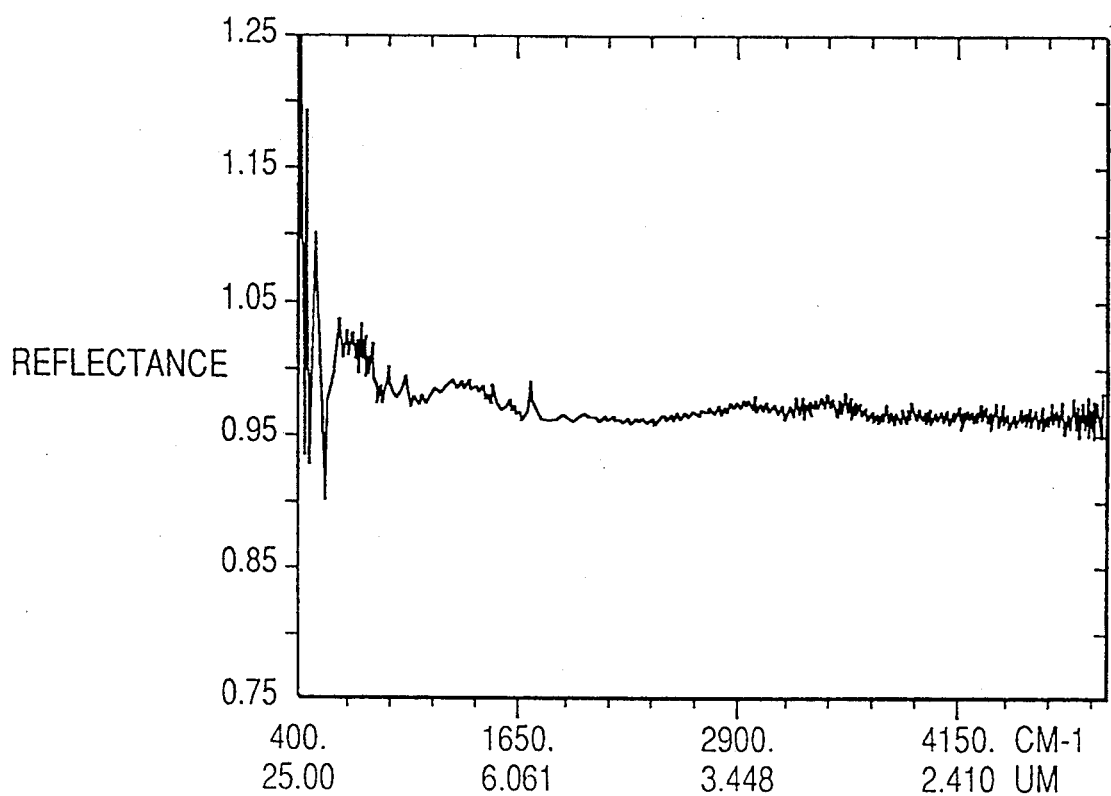

Tables 1 and 2 summarize the results of these tests. In Table 1 quenching occurred in one minute whereas in Table 2 quenching occurred in three to four minutes. The general temperature versus time profile for the LPE tests is shown in FIG. 2. FIG. 3 shows the temperature dependence of resistance of the film specimens measured by the standard 4-point probe method. It is important to note from FIG. 3 that if the specimens are cooled slowly to room temperature after the completion of the growth period the superconducting transition width is rather broad and the samples are epitaxial but not single crystalline (FIG. 3a). Only when they are rapidly quenched do they become single crystalline and exhibit a sharp transition between the normal and the superconducting states (FIG. 3b). The compositional analysis was done by Rutherford Back Scattering (RBS) method, as shown in FIG. 4. The composition of the quenched single crystalline films (from growth regime (iii)) are found to be $Bi_2Ca_{1.05}Sr_{2.1}Cu_{2.19}O_x$ which is in excellent agreement with the theoretical value of $Bi_2CaSr_2Cu_2O_8$. FIG. 5a is the electron diffraction pattern of $NdGaO_3$ single crystal substrate. The highly crystalline nature of the 2122 film is shown in FIG. 5b. A further evidence of the highly epitaxial and crystalline nature of the film of this invention is inferred from the Fourier Transform Infrared (FTIR) measurements of reflectivity vs. wavelength at 300 K. (FIG. 6a) and at 77 K. (FIG. 6b). In the entire far infrared region ($\lambda=2$ to 25 $\mu m$) the 2122 BCSCO film exhibits the theoretical limit of 100% reflectivity at 77 K.

X-ray powder diffraction measurements were done by using $CuK_\alpha$ radiation to identify the phases of the films at different growth temperatures. For the films grown in the range of 880° C. to 860° C. x-ray diffraction analysis showed the presence of a superconducting 2021-phases of BCSCO ($T_c=10$ K.) and nonsuperconducting subphases of $Ca_2CuO_3$, $CaCu_2O_3$ and $CuSrO_2$. The temperature dependence of the resistance for these films when slow cooled showed the typical semiconducting behavior when following the conditions of Table 1, and for the conditions of Table 2 (quenched in 3–4 minutes) these films became superconducting with $T_c$(onset)=70 K. and $T_c$(zero resistance)=10 K. The films grown in the temperature range at 860°–840° C. show the presence of 2122 as well as of the other subphases observed at the growth temperature regime of 880°–860° C. These films exhibit the onset of superconducting transition at 90 K., but zero resistance is not attained above 10 K. unless the film is quenched to room temperature in 3–4 minutes as in Table 2. On quenching in 3–4 minutes as shown in Table 2, these films become superconducting with $T_c$(onset)=80 K. and $T_c$ (zero resistance)=40 K. Films grown in the temperature regimes of 880°–860° C. invariably consist of multiple phases irrespective of slow cooling or quenching although the zero resistance is reached at different temperatures for these two cases (Tables 1 and 2).

and 830° C. and cooled at the rate of (a) 130° C. per hour and (b) 200° C. per minute after the completion of the growth process. The peaks are identified as follows: (*) 2122, (+) $Ca_2CuO_3$, (x) $CaCu_2O_3$, (**) $NdGaO_3$, (°) Cu—Sr oxide, and (#) unidentified. Although very weak in intensity [FIG. 7(a)] as compared to the 2122-phase, one can still observe the peaks attributed to calcium copper oxide. The peaks at 30.85° and 32.85° may be assigned to copper-strontium-oxide but the exact chemical composition is yet to be determined. The peaks of these subphases are completely eliminated when the film is quenched to room temperature at the rate of 200° C. per minute [FIG. 7(b)]. It is, therefore,

TABLE 1

Results of X-ray powder diffraction and Resistance behavior of LPE films at different growth temperature regimes with quenching occurring in one minute

| Growth Temperature °C. | Rate of substrate cooling °C./hr | Phases of BCSCO Main | Subphases | $T_c$ |
|---|---|---|---|---|
| 890–835 | 200 | 2122 | $CaCu_2O_3$ | $T_c$ (onset) = 82 K. |
|  |  | 2021 | $CuSrO_2$ | $T_c$ (Zero) = 40 K. |
| 880–860 | 130 | 2122 | $CaCu_2O_3$ | Semiconducting |
|  |  | 2021 | $Ca_2CuO_3$ |  |
|  |  |  | $CuSrO_2$ |  |
|  | Quenched to room temperature in 1 minute | — | — | Semiconducting |
| 860–840 | 130 | 2122 | $CaCu_2O_3$ | $T_c$ (onset) = 90 K. |
|  |  |  | $Ca_2CuO_3$ | $T_c$ (Zero) = 10 K. |
|  |  |  | $CuSrO_2$ |  |
|  |  |  |  | $T_c$ (onset) = 90 K. |
|  | Quenched to room temperature in 1 minute | — | — | $T_c$ (Zero) = 10 K. |
| 850–830 | 130 | 2122 | $CaCu_2O_3$ | $T_c$ (onset) = 90 K. |
|  |  |  | $Ca_2CuO_3$ | $T_c$ (Zero) = 10 K. |
|  |  |  | $CuSrO_2$ |  |
|  |  |  |  | $T_c$ (onset) = 90 K. |
|  | Quenched to room temperature in 1 minute | 2122 | — | $T_c$ (Zero) = 83 K. |

TABLE 2

Results of X-ray powder diffraction and resistance behavior of LPE films at different growth temperatures regimes with quenching occurring in 3–4 minutes

| Growth Temperature °C. | Rate of substrate cooling °C./hr | Phases of BCSCO Main | Subphases | $T_c$ |
|---|---|---|---|---|
| 890–835 | 200 | 2122 | $CaCu_2O_3$ | $T_c$ (onset) = 82 K. |
|  |  | 2021 | $CuSrO_2$ | $T_c$ (Zero) = 40 K. |
| 880–860 | 130 | 2122 | $CaCu_2O_3$ | Semiconducting |
|  |  | 2021 | $Ca_2CuO_3$ | from room temperature to 45 K. |
|  |  |  | $CuSrO_2$ |  |
|  | Quenched to room temperature, in 3–4 minutes | 2122 2021 | Same as above | $T_c$ (onset) = 70 K. $T_c$ (Zero) = 10 K. |
| 860–840 | 130 | 2122 | $CaCu_2O_3$ | $T_c$ (onset) = 90 K. |
|  |  |  | $Ca_2CuO_3$ | $T_c$ (Zero) = 10 K. |
|  |  |  | $CuSrO_2$ |  |
|  |  |  |  | $T_c$ (onset) = 90 K. |
|  | Quenched to room temperature in 3–4 minutes | 2122 | Same as above | $T_c$ (Zero) = 10 K. |
| 850–830 | 130 | 2122 | $CaCu_2O_3$ | $T_c$ (onset) = 90 K. |
|  |  |  | $Ca_2CuO_3$ | $T_c$ (Zero) = 10 K. |
|  |  |  | $CuSrO_2$ |  |
|  |  |  |  | $T_c$ (onset) = 90 K. |
|  | Quenched to room temperature in 3–4 minutes | 2122 | None | $T_c$ (Zero) = 83 K. |

Figure 7:
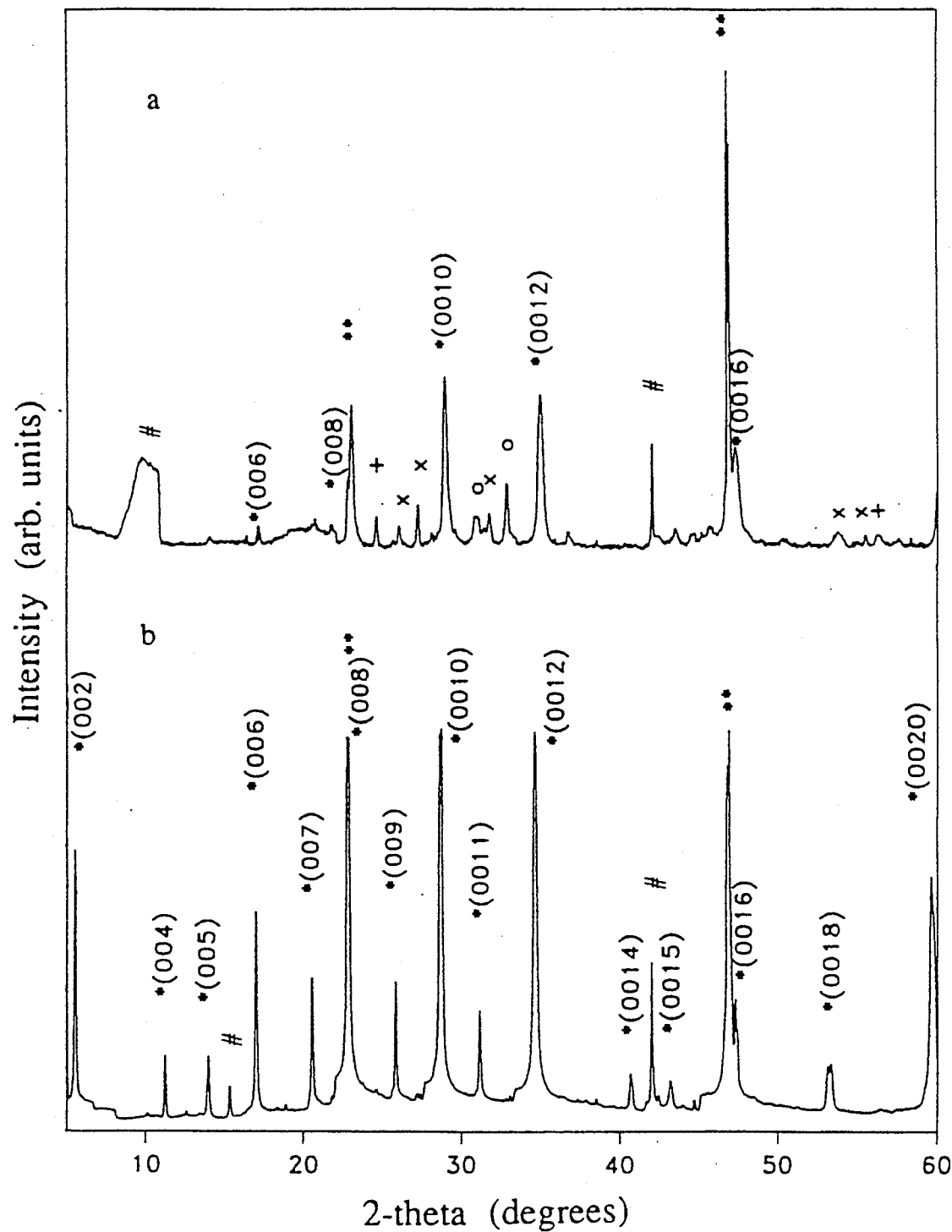
FIGS. 7 is an X-ray diffraction pattern of 2122 BCSCO films cooled at different rates.

The formation of multiple phases is substantially suppressed when the films are grown in the temperature range of 850°–830° C. FIG. 7 illustrates the x-ray powder diffraction patterns of the films grown between 850° inferred that these subphases are suppressed by rapid cooling of the substrates. But for two unidentified peaks, all the major peaks in FIG. 7(b) correspond to the (00l) planes of the 2122 -phase of BCSCO, indicating the growth of a highly c-axis oriented epitaxial film. It is interesting to observe the presence of the odd numbered (00l) planes in this figure. The presence of odd numbered (00l) planes has also been reported for bull single crystals of this material. In FIG. 3 the resistance versus temperature plots of the films grown under the conditions as described for FIG. 7 are shown. For quenched film the onset of the superconducting transition starts at 90 K. and zero resistance is reached at 83 K. This is the highest value of $T_c$ that has been obtained so far on LPE grown films of the 2122 -phase of BCSCO. However, for the specimens cooled at the rate of 130° C. per hour zero resistance is not obtained even at 10 K. This is attributed to the formation of nonsuperconducting phases like calcium cuprate when the films are cooled slowly to room temperature.

The foregoing detailed specification is intended to describe and illustrate the invention without acting as a limitation on its scope, the extent of which is to be determined by reference to the appended claims.

We claim:

1. A supported substantially single phase, single crystalline, highly epitaxial film of the 80 K. BiCaSrCu-oxide superconductor phase having a $T_c$(onset) of 90 K. made according to the method of growing said film on single crystal lattice-matched substrates with no intergrowth, said method comprising the steps of:

(a) forming a dilute supercooled molten solution of a single phase superconducting mixture of oxides of Bi, Ca, Sr, and Cu having an atomic ratio of about 2:1:2:2 in an nonreactive flux;

(b) introducing said substrate into said molten solution at a temperature of about 850° C.;

(c) slowly cooling said molten solution from about 850° C. to about 830° C. to cause the growth on said substrate of said single phase, single crystalline, highly epitaxial film of the 80 K. BiCaSrCu-oxide superconductor phase; and (d) rapidly cooling the film-coated substrate to room temperature at a rate sufficient to maintain the single phase, single crystalline structure of the superconductor film.

2. The film of claim 1 wherein said superconductor phase is $Bi_2Ca_{1.05}Sr_{2.1}Cu_{2.19}O_x$ having a $T_c$ (zero resistance) of 83 K.

3. The film of claim 1 wherein said lattice-matched substrate is a rare earth gallate.

4. The film of claim 3 wherein said rare earth gallate is $NdGaO_3$.

5. The film of claim 1 wherein said nonreactive flux is an alkali metal halide.

6. A substantially single phase, single crystalline, highly epitaxial film of the BiCaSrCu-oxide superconductor phase having a $T_c$ (zero resistance) of 83 K., on a lattice-matched substrate with no intergrowth.

7. The film of claim 6 wherein said superconductor phase is $Bi_2Ca_{1.05}Sr_{2.1}Cu_{2.19}O_x$ having a $T_c$ (onset) of 90 K.

8. The film of claim 6 wherein said lattice-matched substrate is a rare earth gallate.

9. The film of claim 8 wherein said rare earth gallate is $NdGaO_3$.

* * * * *